(12) United States Patent
Mugiya et al.

(10) Patent No.: US 9,055,682 B2
(45) Date of Patent: Jun. 9, 2015

(54) CIRCUIT MODULE

(71) Applicant: Taiyo Yuden Co., Ltd., Tokyo (JP)

(72) Inventors: Eiji Mugiya, Tokyo (JP); Kenzo Kitazaki, Tokyo (JP); Masaya Shimamura, Tokyo (JP)

(73) Assignee: Taiyo Yuden Co., Ltd, Tokyo (JP)

( * ) Notice: Subject to any disclaimer, the term of this patent is extended or adjusted under 35 U.S.C. 154(b) by 0 days.

(21) Appl. No.: 14/086,472

(22) Filed: Nov. 21, 2013

(65) Prior Publication Data

US 2015/0043171 A1 Feb. 12, 2015

(30) Foreign Application Priority Data

Aug. 7, 2013 (JP) ................. 2013-164433

(51) Int. Cl.
  *H05K 7/00* (2006.01)
  *H05K 7/06* (2006.01)
(52) U.S. Cl.
  CPC ....................... *H05K 7/06* (2013.01)
(58) Field of Classification Search
  USPC ........ 361/816, 818, 720, 760, 748; 174/35 R, 174/51, 260–262
  See application file for complete search history.

(56) References Cited

U.S. PATENT DOCUMENTS

| | | | |
|---|---|---|---|
| 7,049,682 B1 * | 5/2006 | Mathews et al. | 257/660 |
| 7,102,896 B2 * | 9/2006 | Ajioka et al. | 361/816 |
| 7,236,070 B2 * | 6/2007 | Ajioka et al. | 333/247 |
| 7,639,513 B2 * | 12/2009 | Otsuki | 361/818 |
| 7,643,311 B2 * | 1/2010 | Coffy | 361/818 |
| 8,031,013 B2 * | 10/2011 | Takeuchi et al. | 331/68 |
| 8,212,340 B2 * | 7/2012 | Liao | 257/660 |
| 8,368,185 B2 * | 2/2013 | Lee et al. | 257/659 |
| 8,592,958 B2 * | 11/2013 | Ko et al. | 257/660 |
| 8,654,537 B2 * | 2/2014 | Fisher et al. | 361/750 |
| 2004/0252475 A1 * | 12/2004 | Tsuneoka et al. | 361/816 |
| 2006/0258050 A1 | 11/2006 | Fujiwara et al. | |

(Continued)

FOREIGN PATENT DOCUMENTS

JP S61-182098 U 11/1986
JP 2000-286512 A 10/2000

(Continued)

OTHER PUBLICATIONS

Office Action issued in Japanese Application No. 2013-170459 dated Nov. 26, 2013 and English translation of the same (7 pages).

*Primary Examiner* — Hung S Bui
(74) *Attorney, Agent, or Firm* — Fitch Even Tabin & Flannery LLP (57) ABSTRACT

There is provided a circuit module including a circuit substrate being a wiring substrate having a mount surface, a surface wiring layer disposed on the mount surface, and an inner wiring layer formed within the substrate, a first mount component mounted on the mount surface, a second mount component mounted on the mount surface, and electrically connected to the first mount component via the inner wiring layer, a sealing body formed on the mount surface, covering the first mount component and the second mount component and having a trench formed from a main surface of the sealing body to the surface wiring layer between the first mount component and the second mount component, and a shield having an inner shield section formed within the trench that abuts on the surface wiring layer and an outer shield section covering the sealing body and the inner shield section.

3 Claims, 9 Drawing Sheets

(56) References Cited

U.S. PATENT DOCUMENTS

| | | | |
|---|---|---|---|
| 2009/0002967 A1* | 1/2009 | Asami | 361/816 |
| 2012/0000699 A1 | 1/2012 | Inoue | |
| 2012/0008288 A1 | 1/2012 | Tsukamoto et al. | |
| 2012/0080221 A1 | 4/2012 | Sekine | |
| 2012/0140423 A1* | 6/2012 | Fisher et al. | 361/748 |
| 2012/0286415 A1 | 11/2012 | Sakai et al. | |
| 2013/0301227 A1 | 11/2013 | Kawano | |

FOREIGN PATENT DOCUMENTS

| | | |
|---|---|---|
| JP | 2005-317935 A | 11/2005 |
| JP | 2010-153667 A | 7/2010 |
| JP | 2010-225620 A | 10/2010 |
| JP | 2012-019091 A | 1/2012 |
| JP | 2012-079994 A | 4/2012 |
| JP | 2012-256842 A | 12/2012 |
| WO | 2012/101920 A1 | 8/2012 |

* cited by examiner

CIRCUIT MODULE

CROSS-REFERENCE TO RELATED APPLICATION

This application claims priority under 35 U.S.C. §119 to Japanese Patent Application No. JP 2013-164433 filed on Aug. 7, 2013, the entire content of which is hereby incorporated herein by reference in its entirety.

FIELD

The present disclosure relates to a circuit module including a circuit substrate on which at least one mount component is mounted and sealed.

BACKGROUND

There is known a circuit module, on which a plurality of mount components are mounted on a circuit substrate, mounted on a variety of electronic devices. In general, such a circuit module has a configuration that an electromagnetic shield is formed on a sealing body covering the mount components to prevent an interruption (electromagnetic interruption) caused by electromagnetic waves within and outside of the module.

In addition, when the plurality of mount components are mounted on the circuit substrate, there is developed a circuit module where the inner shields are provided to separate the mount components in order to prevent the electromagnetic interruption between the mount components. As the mount components are covered with the sealing bodies as described above, the sealing bodies are partly removed to form trenches (grooves) and the trenches are filled with a conductive material to provide the inner shields.

For example, Japanese Patent Application Laid-open No. 2010-225620 discloses a module component where a trench is formed in a sealing body covering a plurality of mount components into a circuit substrate, and a conductor is formed within the trench. The plurality of mount components are mutually connected via an inner wiring layer formed at downward of the trench.

SUMMARY

However, in the module component described in Japanese Patent Application Laid-open No. 2010-225620, the trench is formed into the circuit substrate. Therefore, the wiring layer connecting the components has to be formed at lower than the trench. This may prolong a connection length between the components, and cause a damage to signal characteristics between the components. In addition, when the conductor is connected to a ground terminal on a substrate surface layer, it is difficult to provide sufficient connection and desirable shielding effectiveness stably.

In view of the above-described circumstances, it is desirable to provide a circuit module where shielding effectiveness between a plurality of mount components can be stably maintained, and deterioration of signal characteristics between the mount components can be inhibited.

According to an embodiment of the present disclosure, there is provided a circuit module including a circuit substrate, a first mount component, a second mount component, a sealing body, and a shield.

The circuit substrate is a wiring substrate having a mount surface, a surface wiring layer disposed on the mount surface, and an inner wiring layer formed within the substrate.

The first mount component is mounted on the mount surface.

The second mount component is mounted on the mount surface, and is electrically connected to the first mount component via the inner wiring layer.

The sealing body is formed on the mount surface, covers the first mount component and the second mount component and has a trench formed from a main surface of the sealing body to the surface wiring layer between the first mount component and the second mount component.

The shield has an inner shield section formed within the trench that abuts on the surface wiring layer and an outer shield section covering the sealing body and the inner shield section.

These and other objects, features and advantages of the present disclosure will become more apparent in light of the following detailed description of best mode embodiments thereof, as illustrated in the accompanying drawings.

DETAILED DESCRIPTION OF THE EMBODIMENTS

A circuit module according to an embodiment of the present disclosure includes a circuit substrate, a first mount component, a second mount component, a sealing body, and a shield.

The circuit substrate is a wiring substrate having a mount surface, a surface wiring layer disposed on the mount surface, and an inner wiring layer formed within the substrate.

The first mount component is mounted on the mount surface.

The second mount component is mounted on the mount surface, and is electrically connected to the first mount component via the inner wiring layer.

The sealing body is formed on the mount surface, covers the first mount component and the second mount component and has a trench formed from a main surface of the sealing body to the surface wiring layer between the first mount component and the second mount component.

The shield has an inner shield section formed within the trench that abuts on the surface wiring layer and an outer shield section covering the sealing body and the inner shield section.

In the circuit module, the trench is not formed within the circuit module. In this way, the inner wiring layer adjacent to the surface wiring layer can connect the first and second mount components to shorten the connection length. Accordingly, resistance between the first and second mount components can be decreased, and deterioration of signal characteristics between the components can be inhibited.

In addition, the inner shield section can be connected to the surface wiring layer exposed at a bottom of the trench. In this way, the inner shield section can be connected to the surface wiring layer on a flat surface having a sufficient area. Accordingly, the shield can be stably grounded via the surface wiring layer, and shielding effectiveness can be improved.

The inner wiring layer includes a plurality of inner wiring layers, and the first mount component and the second mount component may be mutually electrically connected by the inner wiring layer adjacent to the surface wiring layer among the plurality of inner wiring layers.

In this way, the connection length between the first and second mount components can be further shortened, which contributes to prevention of deterioration of signal characteristics.

The circuit substrate further includes a component-containing layer formed between the plurality of inner wiring layers for containing a built-in component.

The wiring layer may be disposed at a mount surface side rather than at the component-containing layer. In this way, the connection length between the first and second mount components can be further shortened, when the circuit substrate is a substrate with built-in component.

In this case, the circuit substrate may further include a conductive core section formed on the component-containing layer and disposed surrounding the built-in component.

In this way, stiffness of the circuit substrate can be improved, and the built-in component can be protected. Also, heat dissipation can be improved. Furthermore, an interruption induced by electromagnetic waves inside and outside of the built-in component can be inhibited, and circuit module failure or deterioration of signal characteristics can be prevented.

The circuit module according to an embodiment of the present disclosure will be described.

[Configuration of Circuit Module]

Figure 1:
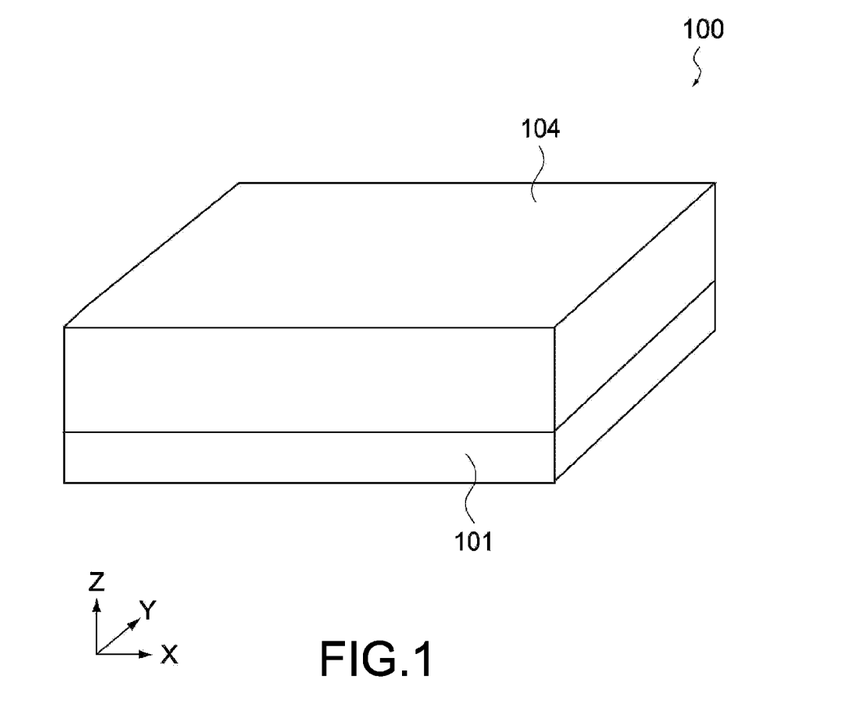
FIG. 1 is a perspective view of a circuit module according to a first embodiment of the present disclosure.
Figure 2:
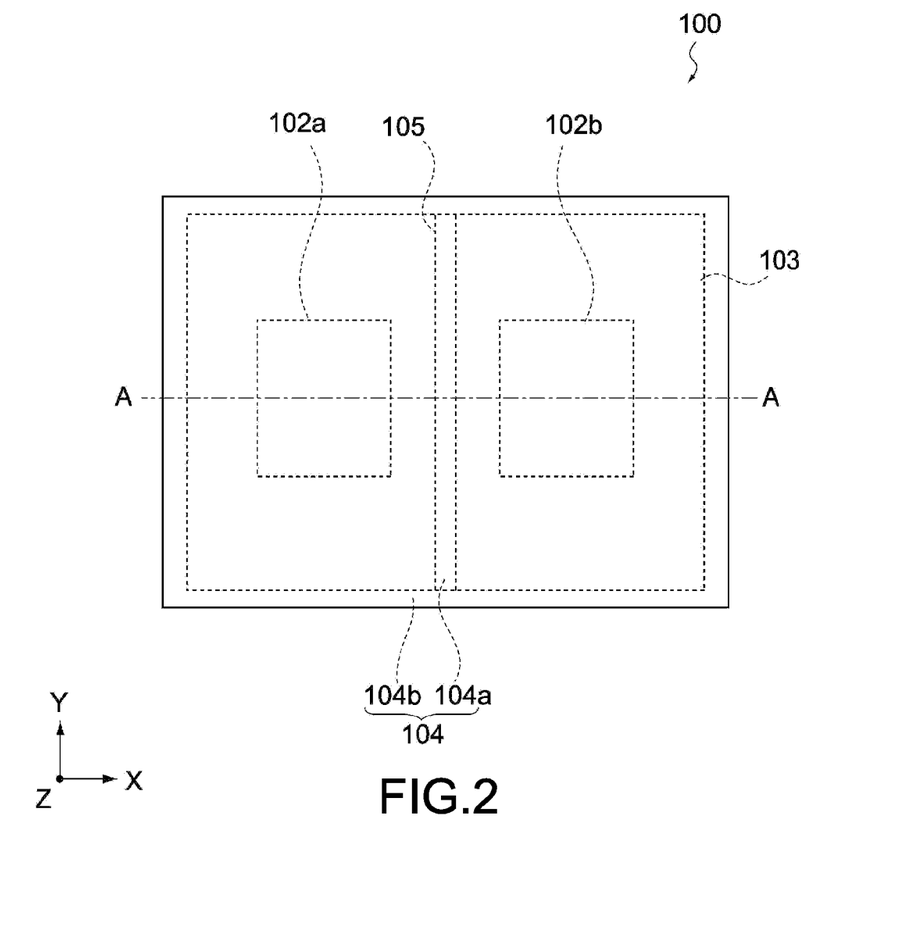
FIG. 2 is a plan view of the circuit module.
Figure 3:
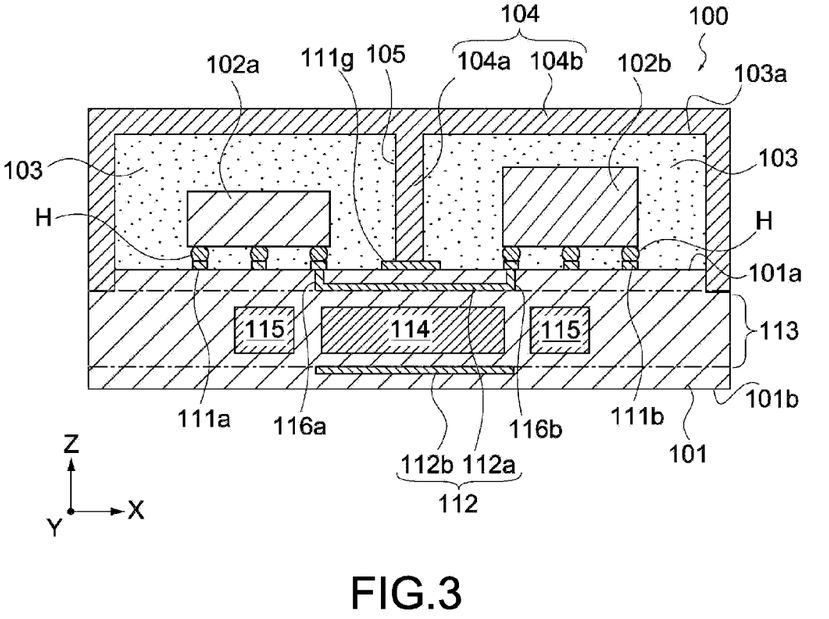
FIG. 3 is a sectional view of the circuit module (along the A-A line shown in FIG. 2)

FIG. 1 is a perspective view of a circuit module 100 according to an embodiment of the present disclosure. FIG. 2 is a plan view of the circuit module 100. FIG. 3 is a sectional view of the circuit module 100 along the A-A line in FIG. 2. In each view, an X axis direction, an Y axis direction and a Z axis direction are orthogonal each other. The Z axis direction indicates a thickness direction (a vertical direction) of the circuit module.

As shown in FIGS. 1 to 3, the circuit module 100 includes a circuit substrate 101, a first mount component 102a, a second mount component 102b, sealing bodies 103, and a shield 104. In the circuit module 100, the first mount component 102a and the second mount component 102b are disposed on the circuit substrate 101, and the sealing bodies 103 and the shield 104 are formed to cover these mount components. Although a size or a shape of the circuit module 100 is not especially limited, the circuit module 100 may be a rectangular parallelepiped having a size of tens mm squares and a thickness of several mms.

On the circuit substrate 101, the first mount component 102a, the second mount component 102b and the like are mounted. As shown in FIG. 3, the circuit substrate 101 is configured of a wiring substrate having the mount surface 101a and a terminal surface 101b at an opposite side thereof. The circuit substrate 101 includes a surface wiring layer 111 (see FIG. 4) and an inner wiring layer 112 formed within the circuit substrate 101. Each wiring layer is laminated on the circuit substrate 101 via an insulation layer. Typically, each wiring layer on the circuit substrate 101 is configured of a copper foil patterned in a predetermined shape, but is not limited thereto. Typically, the insulation layer of the circuit substrate 101 is made of a glass epoxy-based material, but is not limited thereto and can be made of an insulating ceramic material.

Figure 4:
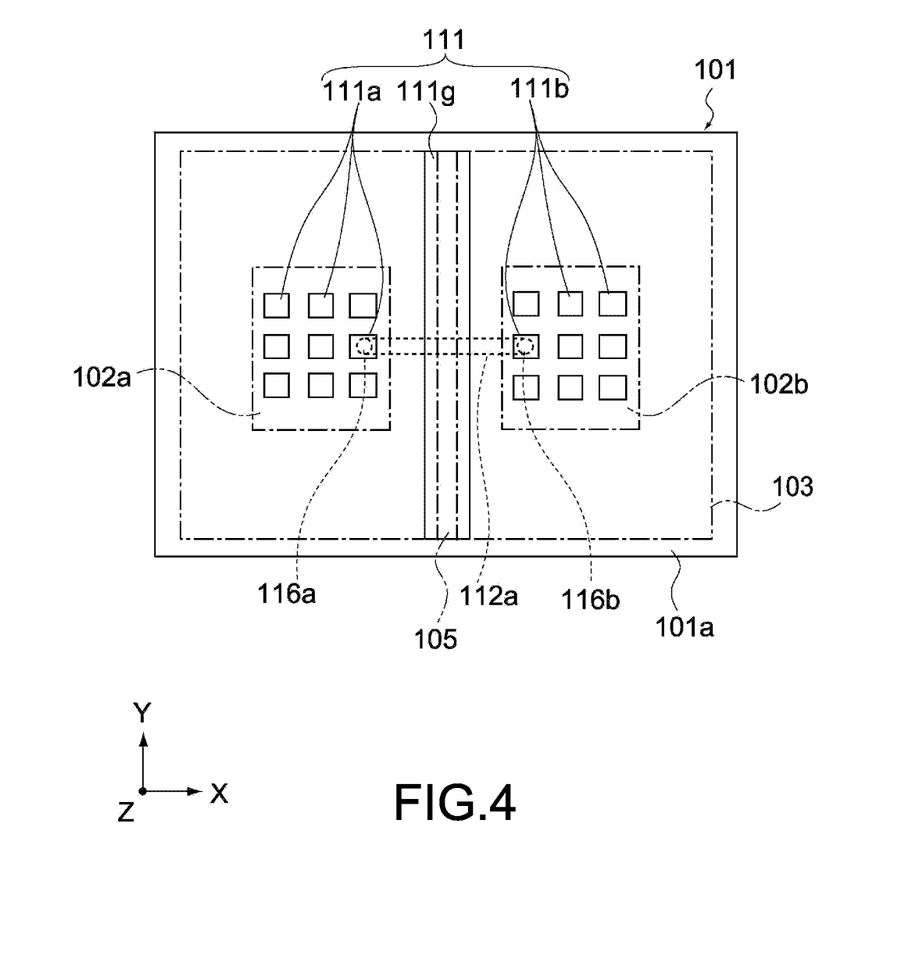
FIG. 4 is a plan view of a circuit substrate of the circuit module.

FIG. 4 is a plan view of the circuit substrate 101. As shown in FIG. 4, the surface wiring layer 111 includes a ground conductor 111g connected to a ground (GND) potential, lands 111a and lands 111b, and is disposed on the mount surface 101a. According to the present embodiment, the ground conductor 111g is disposed along a trench 105 as described later, and is connected to the ground potential. The lands 111a and the lands 111b are connected to respective terminals of the first mount component 102a and the second mount component 102b mounted on the mount surface 101a. The configuration of the surface wiring layer 111 is not limited to that shown in FIG. 4 etc., and may be a wiring pattern according to a desirable circuit design.

According to the present embodiment, the inner wiring layer 112 includes a plurality of inner wiring layers, specifically, includes an upper wiring layer 112a and a lower wiring layer 112b, as shown in FIG. 3. The upper wiring layer 112a is the inner wiring layer adjacent to the surface wiring layer 111 of the plurality of inner wiring layers. The lower wiring layer 112b faces to the upper wiring layer 112 across a component-containing layer 113 as described later, and is formed at a terminal surface 101b side. The configuration of the surface wiring layer 112 is not limited to that as described above, and may be a desirable wiring pattern similar to the surface wiring layer 111. Although not shown, the surface wiring layer including external connection terminals that can be connected to other electronic devices may be disposed on the terminal surface 101b.

The upper wiring layer 112a is connected to the lands 111a and the lands 111b via a via 116a and a via 116b. The via 116a and the via 116b are conductors extending in a depth direction (the Z axis direction) of the circuit substrate 101. The via 116a connects the lands 111a to the upper wiring layer 112a. The via 116b connects the lands 111b to the upper wiring layer 112a. Thus, the lands 111a, the via 116a, the upper wiring layer 112a, the via 116b and the lands 111b are electrically connected. The via 116a and the via 116b may have non-limiting configurations. For example, the via 116a and the via 116b can have a configuration where studs or pins are used or where conductors are buried into holes formed by laser processing, etching etc.

Thus, the upper wiring layer 112a is configured such that the first mount component 102a and the second mount component 102b are mutually electrically connected. In addition, the upper wiring layer 112a passes through beneath the trench 105 and the ground conductor 111g formed on the mount surface 101a in the Z axis direction such that the first mount component 102a is separated from the second mount component 102b, as shown in FIG. 3, FIG. 4 etc.

Furthermore, according to the present embodiment, the circuit substrate 101 is the substrate with built-in component including the component-containing layer 113 that contains a built-in component 114 and is formed between the plurality of inner wiring layers 112.

Figure 5:
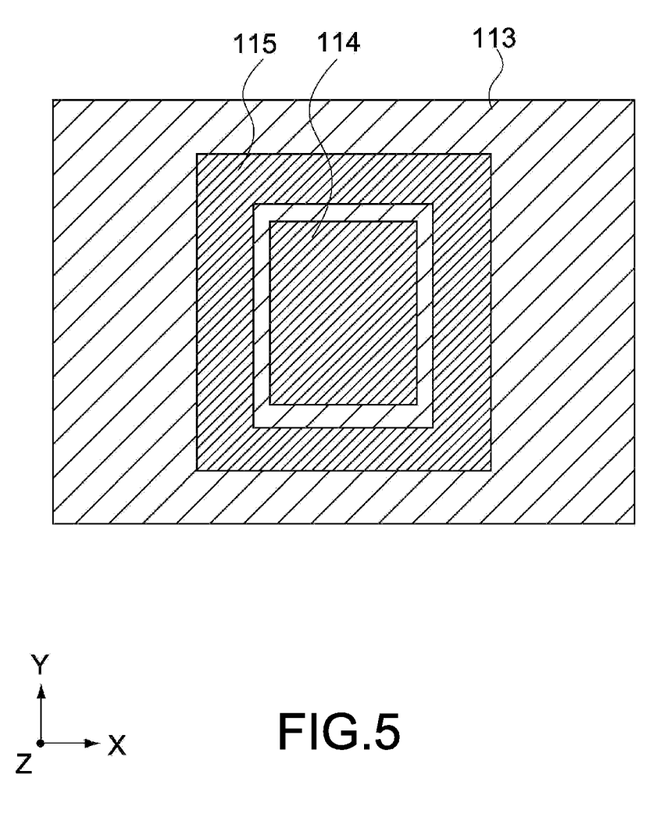
FIG. 5 is a sectional view of a component-containing layer of the circuit module viewed from a Z axis direction.

FIG. 5 is a sectional view of the component-containing layer 113 viewed from the Z axis direction, and shows a section including the built-in component 114 and a core section 115. The component-containing layer 113 is formed between the upper wiring layer 112a and the lower wiring layer 112b, and contains a predetermined built-in component 114. In the component-containing layer 113, the built-in component 114 and the core section 115 as described later are buried into the insulation layer. The built-in component 114 can be a capacitor, an inductor, a resistor, a crystal oscillator, a duplexer, a filter, a power amplifier, an integrated circuit (IC), or the like, for example. The built-in component 114 is connected to the inner wiring layer 112 via a terminal or the like (not shown).

According to the present embodiment, the circuit substrate 101 further includes the conductive core section 115 formed in the component-containing layer 113 and disposed surrounding the built-in component 114. The shape of the core section 115 is not especially limited as long as the core section 115 has a space where the built-in component 114 is contained. For example, as shown in FIGS. 3 and 5, the core section 115 may have an annular rectangle circle having a thickness roughly the same as the built-in component 114. For example, the core section 115 may be made of copper, a copper alloy etc., and is connected to the ground potential via the inner wiring layer 112. The core section 115 has functions to increase stiffness of the circuit substrate 101 and protect the built-in component 114. Also, the core section 115 can improve heat dissipation.

The component-containing layer 113 may contain a plurality of built-in components 114. In this case, a plurality of core sections 115 are disposed around the built-in components 114, thereby preventing the interruption (electromagnetic interruption) caused by electromagnetic waves between the plurality of built-in components 114.

Any of the first mount component 102a and the second mount component 102b is an electronic component or the like mounted on the mount surface 101a of the circuit substrate 101, and is an integrated circuit (IC), a capacitor, an inductor, a resistor, a crystal oscillator, a duplexer, a filter, a power amplifier, or the like, for example. As illustrated, the circuit substrate 101 has two mount components (the first mount component 102a and the second mount component 102b). However, the number or position of mount components is not especially limited.

The first mount component 102a has a plurality of terminals (not shown) connected to the lands 111a by soldering using solder H. Among the lands 111a connected to the plurality of terminals, the land 111a positioned near the trench 105 as described later is connected to the via 116a, for example.

Similarly, the second mount component 102b has a plurality of terminals connected to the predetermined lands 111b by solder joint using solder H. Among the lands 111b connected to the plurality of terminals, the land 111b positioned near the trench 105 as described later is connected to the via 116b, for example. As described above, the second mount component 102b is electrically connected to the first mount component 102a via the upper wiring layer 112a of the inner wiring layer 112.

The sealing bodies 103 are formed on the mount surface 101a, and cover the first mount component 102a and the second mount component 102b. According to the present embodiment, the sealing bodies 103 are formed of an insulation sealing material. Specifically, as the sealing material, an epoxy resin to which silica or alumina is added can be used. After the first mount component 102a and the second mount component 102b are mounted on the mount surface 101a, peripherals of the first mount component 102a and the second mount component 102b are filled with a fluid sealing material and the sealing material is cured to provide the sealing bodies 103.

The sealing bodies 103 has a trench 105 formed from the main surface 103a to the mount surface 101a.

The trench 105 is formed by removing the sealing bodies 103 in a groove shape. Although a length of the trench 105 is not especially limited, the trench 105 is formed to the ground conductor 111g of the surface wiring layer 111. Thus, a bottom surface of the trench 105 is configured of the surface wiring layer 111. A cross-section shape of a wall surface of the trench 105 is not especially limited. For example, as shown in FIG. 3, the wall surface may be formed being almost perpendicular or tapered to the mount surface 101a.

The shape of the trench 105 viewed from the Z axis direction is such that the mount component 102a is separated from the mount component 102b, as shown in FIGS. 2 and 4. The shape of the trench 105 viewed from the Z axis direction is not especially limited, and may depend on the types or positions of the first mount component 102a and the second mount component 102b.

The shield 104 covers the sealing bodies 103 and functions as a shield against the electromagnetic interruption. According to the present embodiment, the shield 104 is made of a shielding material that is a conductive material. Specifically, the shielding material may be a conductive resin such as an epoxy resin containing conductive particles such as Ag and Cu.

The shield 104 has the inner shield section 104a formed in the trench 105, and the outer shield section 104b covering the sealing bodies 103 and the inner shield section 104a, as shown in FIG. 3 etc. The inner shield section 104a is formed by filling the trench 105 with the shielding material. The inner shield section 104a abuts on and is electrically connected to the ground conductor 105 via the trench 105. On the other hand, the outer shielding section 104b covers the sealing bodies 103 and the inner shield section 104a.

Next, A method of producing the circuit module 100 will be described.

[Method of Producing Circuit Module]

FIGS. 6A to 6C, FIGS. 7A to 7C and FIGS. 8A and 8B each is a schematic view showing a method of producing the circuit module 100. The plurality of circuit modules 100 can be produced on one circuit substrate at the same time, and be divided into each circuit module 100. Hereinbelow, one of the circuit modules 100 will be described. The following description is illustrative, and a method of producing the circuit module 100 is not limited thereto.

Figure 6A:
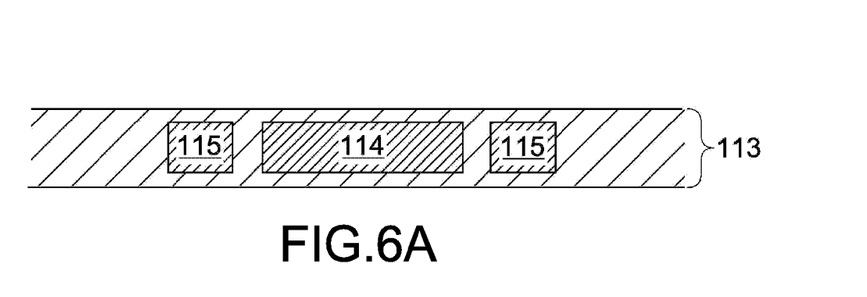
FIGS. 6A to 6C each is a schematic view showing a method of producing the circuit module.

As shown in FIG. 6A, the component-containing layer 113 is formed. Firstly, the core section 115 formed in a predetermined shape and the built-in component 114 are disposed and temporarily fixed on an adhesive sheet at predetermined positions. Then, the adhesive sheet is filled with a fluid insulation material, which is cured. In addition, the adhesive sheet is peeled, and the insulation material is coated and cured on a peeled side. In this way, the component-containing layer 113 having a structure where the built-in component 114 and the core section 115 are buried into the insulation layer.

Figure 6B:
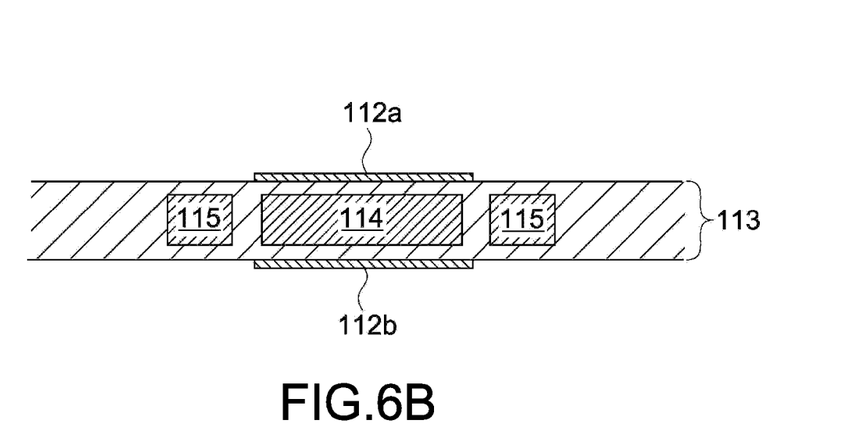

Next, as shown in FIG. 6B, the upper wiring layer 112a is formed on an upper surface of the component-containing layer 113, and the lower wiring layer 112b is formed on a lower surface of the component-containing layer 113. Firstly, conductor films are formed on the upper and lower surfaces of the component-containing layer 113 by plating. Then, the conductor films are etched to the predetermined shape to form the upper wiring layer 112a and a lower wiring layer 112b.

Figure 6C:
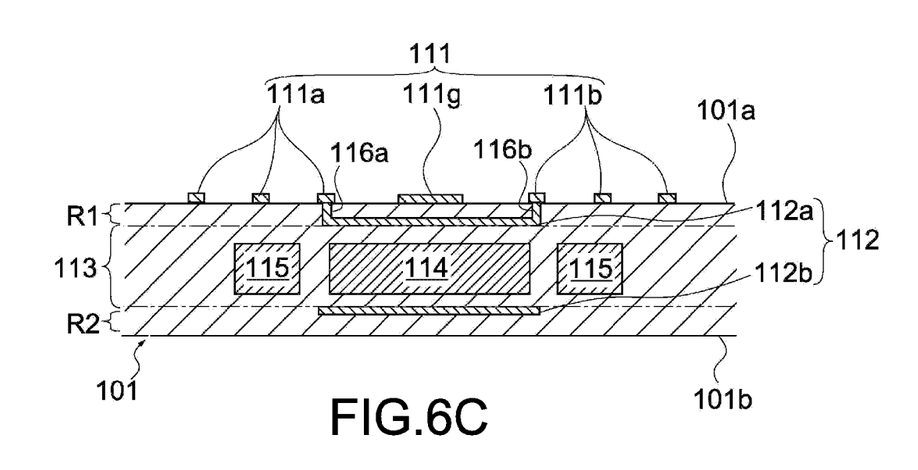

Then, as shown in FIG. 6C, the vias 116a, the vias 116b and the surface wiring layer 111 are formed. Firstly, a liquid or paste insulation material is coated and cured on an upper surface of the component-containing layer 113 on which the upper wiring layer 112a is formed and a lower surface of the component-containing layer 113 on which the lower wiring layer 112b is formed. Thus, an upper insulation layer R1 and a lower insulation layer R2 are formed.

Then, the vias 116a and the vias 116b are formed from the upper insulation layer R1 to the upper wiring layer 112a. For example, the via 116a and the via 116b can be formed by burying conductors such as studs and pins. In addition, a conductor film is formed on a surface of the upper insulation layer R1 where the vias 116a and the vias 116b are formed by soldering etc. The conductor film is etched to the predetermined shape, thereby forming the surface wiring layer 111 including the ground conductor 111g, the lands 111a and the lands 111b. A method of forming the vias 116a and the vias 116b is not limited to the above. After the upper insulation layer R1 is formed, holes may be formed by laser processing, etching etc., the conductors may be formed in the holes by plating etc. while the conductor layer is formed that will become the surface wiring layer 111.

Figure 7A:
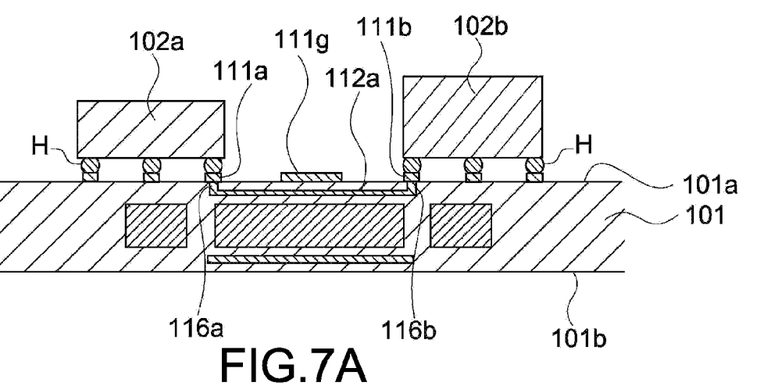
FIGS. 7A to 7C each is a schematic view showing a method of producing the circuit module.

Next, as shown in FIG. 7A, the first mount component 102a is mounted on the land 111a, and the second mount component 102b is mounted on the land 111b of the mount surface 101a of the circuit substrate 101. Mounting can be performed by a variety of mounting methods including solder joint etc. In this way, the first mount component 102a and the second mount component 102b are mutually electrically connected via the via 116a, the via 116b and the upper wiring layer 112a.

Figure 7B:
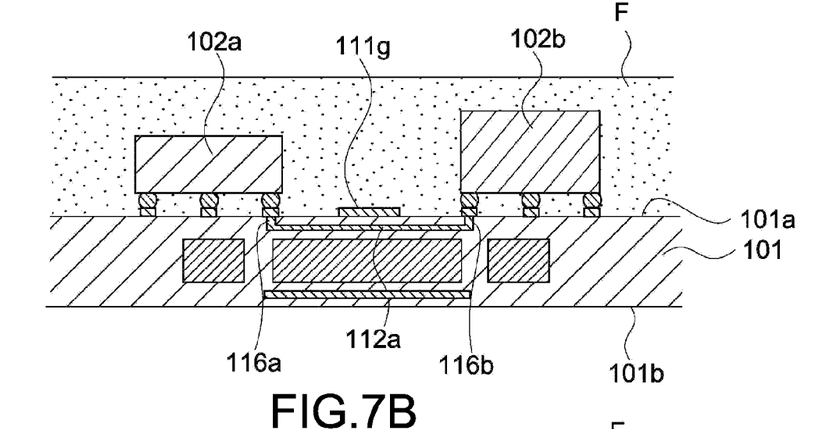

Next, as shown in FIG. 7B, on the mount surface 101a, a liquid or a paste sealing material F is coated to cover the first mount component 102a and the second mount component 102b. Coating of the sealing material F can be done by a vacuum printing method, a spin coating method or the like. After the sealing material F is coated on the mount surface 101a, the sealing material F is heated by baking, etc. and cured.

Figure 7C:
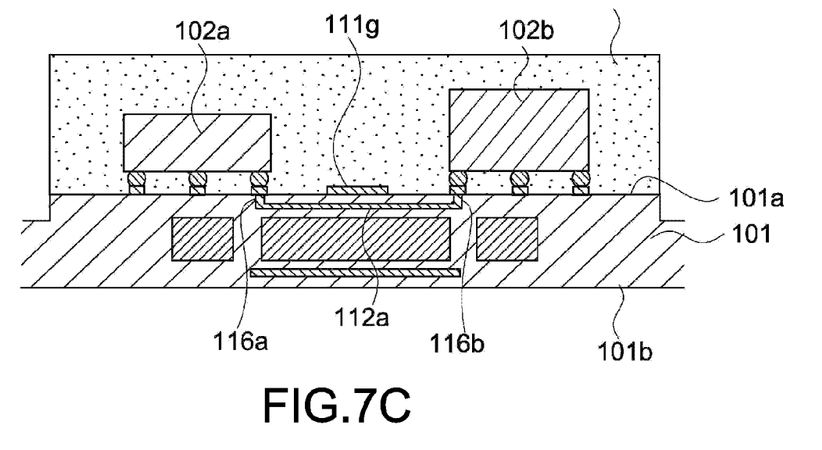

Next, as shown in FIG. 7C, the sealing material F is half-cut per the circuit module 100. For example, the sealing material F can be half-cut by a dicer.

Figure 8A:
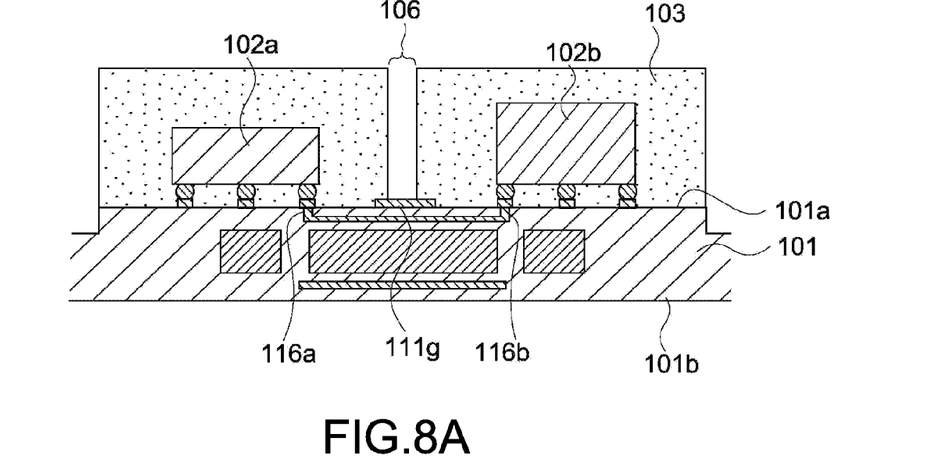
FIGS. 8A and 8B each is a schematic view showing a method of producing the circuit module.

Next, as shown in FIG. 8A, the trench 105 reaching the ground conductor 111g is formed. The trench 105 is formed by irradiating the sealing material F with laser L and scanning. The trench 105 may be formed before the sealing material F is half-cut.

Figure 8B:
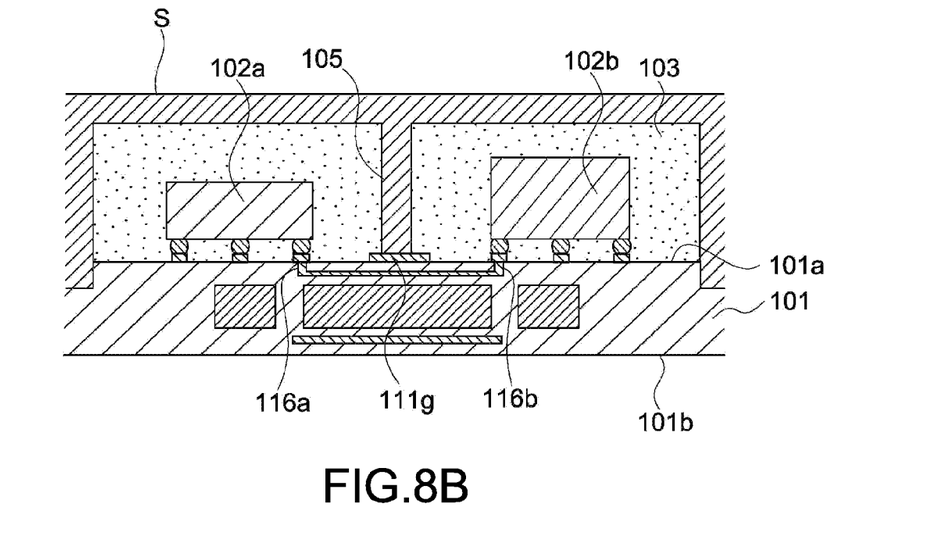

Next, the shield 104 is formed on the sealing bodies 103. Firstly, as shown in FIG. 8B, a sealing material S is coated by the vacuum printing method or the like. In this way, an entire surface of each sealing body 103 including the trench 105 is filled with the shield material S. Next, the sealing material S applied is heated by baking, etc. as predetermined. The conditions of heating can be determined depending on the properties of the shield material S as appropriate. In this way, as shown in FIG. 3, the shield 104 having the inner shield section 104a and the outer shield section 104b is formed.

Next, the shield 104 and the circuit substrate 101 are cut (full-cut) per circuit module 100. For example, the shield 104 and the circuit substrate 101 can be cut by the dicer. In this way, the circuit module 100 is produced.

[Advantages]

Figure 9:
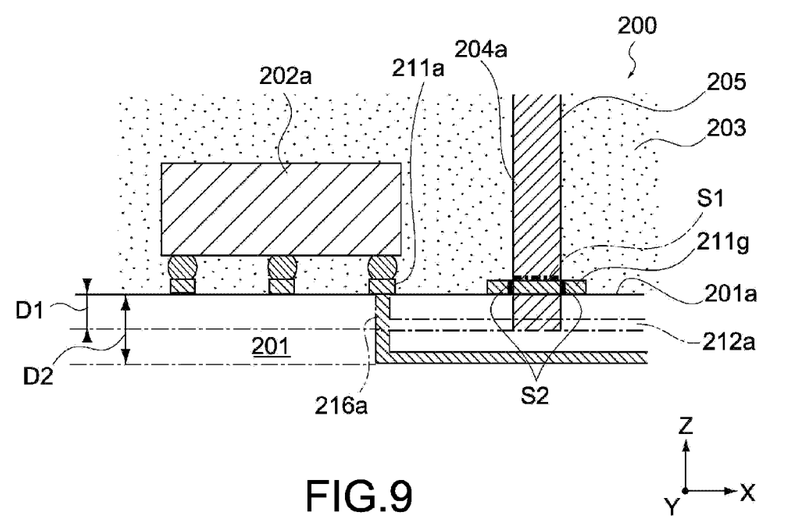
FIG. 9 is an enlarged schematic sectional view of a circuit module according to a comparative embodiment.

FIG. 9 is an enlarged schematic sectional view of a circuit module according to a comparative embodiment. A circuit module 200 shown in FIG. 9 includes a circuit substrate 201 having a mount surface 201a, a ground conductor 221g and a land 211a etc., a first mount component 202a and a second mount component mutually electrically connected, sealing bodies 203 having a trench 205, and a shield having an inner shield section 204a and an outer shield section, similar to the circuit module 100. However, the circuit module 200 is different from the circuit module 100 in that a trench 205 passes through the ground conductor 211g and is formed into the circuit substrate 201. FIG. 9 shows a major portion of the circuit module 200, and does not show the second mount component, the outer shield section etc.

As shown in FIG. 9, if the trench 205 passes through the ground conductor 211g and is formed into the circuit substrate 201, a via 216a should be formed to a depth D2 deeper than a depth D1 of the trench 205 to connect the first mount component 202a to the second mount component.

In the circuit module 100 according to the present embodiment, as the trench 105 is formed to a depth of the surface wiring layer 111 (the ground conductor 111g), the depth D1 of each of the via 116a and the via 116b can be shallower than the depth D2. Thus, it is possible to shorten the connection length between the first mount component 102a and the second mount component 102b. Thus, deterioration of signal characteristics between the first mount component 102a and the second mount component 102b can be inhibited.

In addition, as shown in FIG. 9, if the trench 205 passes through the ground conductor 211g, the inner shield section 204a is connected to the ground conductor 211g only at a side surface S2 of the trench 205. On the other hand, according to the present embodiment, the inner shield section 104a is connected to the ground conductor 111g at a bottom surface S1 of the trench 105 having an area wider than a bottom surface S2. In this way, it is possible to decrease interconnection resistance between the inner shield section 104a and the ground conductor 111g. By connecting at the bottom surface S1 being almost flat, the inner shield section 104a can be more stably connected to the ground conductor 111g. As a result, it is possible to assuredly inhibit the electromagnetic interruption between the first mount component 102a and the second mount component 102b caused by the inner shield section 104a.

Furthermore, the trench 105 can be shallower to be formed to the depth of the surface wiring layer 111 as compared with the case that the trench 105 is formed into the circuit substrate 201. In this way, the trench 105 can be easily filled with the shielding material when the inner shield section 104a is formed. As a result, it is possible to inhibit a poor connection caused by insufficient filling of the shielding material, and to provide stable shielding effectiveness.

On the other hand, if the circuit substrate 101 is configured as the substrate with built-in component, the first mount component 102a should be connected to the second mount component 102b by the inner wiring layer at either of a mount surface 101a side or a terminal surface 101b side across the component-containing layer 113.

Figure 10:
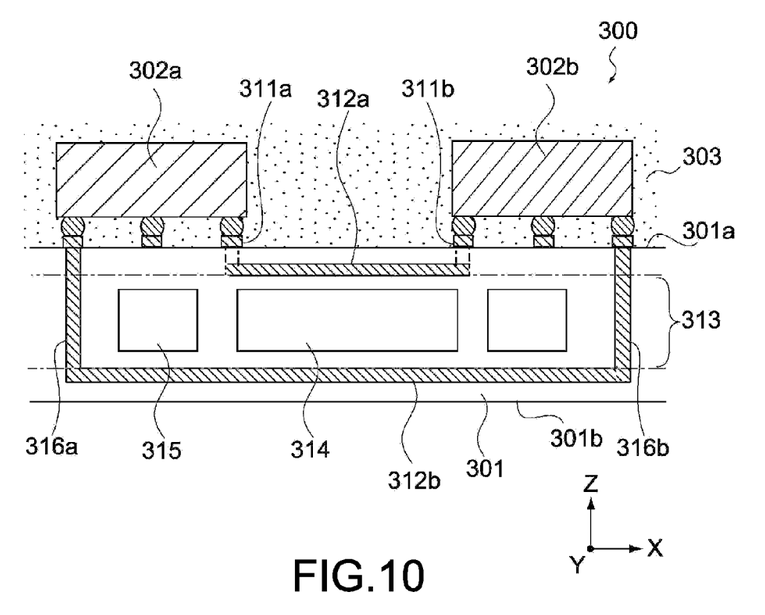
FIG. 10 is an enlarged schematic sectional view of a circuit module according to a comparative embodiment.

FIG. 10 is an enlarged schematic sectional view of a circuit module according to a comparative embodiment. A circuit module 300 shown in FIG. 10 includes a circuit substrate 301 having a mount surface 301a, a first mount component 302a and a second mount component 302b mutually electrically connected, sealing body 303, and a shield. On the mount surface 301a of the circuit substrate 301, a land 311a and land 311b are formed, and a component-containing layer 313, an upper wiring layer 312a, a lower wiring layer 312b, a via 316a and a via 316b are formed within the circuit module 300. However, the circuit module 300 is different from the circuit module 100 in that the first mount component 302a is connected to the second mount component 302b by the lower wiring layer 312b. FIG. 10 shows a major portion of the circuit module 300, and does not show the trench, the shield etc.

As shown in FIG. 10, if the first mount component 302a is connected to the second mount component 302b by the lower wiring layer 312b, the via 316a and the via 316b should be formed deeper than the upper wiring layer 312a and the lower wiring layer 312b. In addition, the via 316a and the via 316b should be formed bypassing the built-in component 314 and the core section 315.

According to the present embodiment, as the first mount component 102a is connected to the second mount component 102b by the upper wiring layer 112a, it is possible to form the via 116a and the via 116b shallower than those formed by the lower wiring layer 312b. In addition, the positions of the via 116a and the via 116b can be determined not depending on the positions of the built-in component 114 and the core section 115. Thus, a length of the wiring between the via 116a and the via 116b viewed from the Z axis direction can be shorten (see FIG. 4). In this way, it is possible to shorten the connection length between the first mount component 102a and the second mount component 102b if the circuit substrate 101 is the substrate with built-in component. Accordingly, resistance between the first mount component 102a and the second mount component 102b can be decreased, and deterioration of signal characteristics between the first mount component 102a and the second mount component 102b can be inhibited.

Furthermore, as the via 116a and the via 116b can be formed shallower, the formation method is not limited to form a plated conductor within the hole, but is to directly bury a stud or a pin into the insulation layer. In this way, the via 116a and the via 116b can be formed easily, which is advantageous in a production point of view.

[Alternative Embodiment]

The circuit substrate 101 of the circuit module 100 is not limited to the above-described wiring substrate with built-in component, and can be configured of a wiring substrate to provide a desirable circuit configuration.

As described above, the configuration of each wiring layer of the circuit substrate 101 is not limited, and desirable wiring patterns can be used. For example, there may be a wiring to connect the upper wiring layer 112a to the built-in component 114. Also, conductor vias may be formed to connect the respective wiring layers as appropriate. In addition, the first and second mount components 102a and 102b are not only connected through the upper wiring layer 112a adjacent to the surface wiring layer 111, and but also connected through the second or later inner wiring layer(s).

Although it is described that the trench 105 abuts on the ground conductor 111g of the surface wiring layer 111, it is not limited thereto and the trench 105 may abut on other portions of the surface wiring layer 111.

The plurality of mount components is not limited to two mount components 102a and 102b, and may be three or more mount components. In this case, the shapes of the trenches can be determined depending on the types or positions of the mount components. Furthermore, the component-containing layer 113 may have the plurality of mount components and the plurality of core sections surrounding the respective mount components.

While the embodiments of the present disclosure are described, it should be appreciated that the disclosure is not limited to the above-described embodiments, and variations and modifications may be made without departing from the spirit and scope of the present disclosure.

What is claimed is:

1. A circuit module, comprising:
   a circuit substrate being a wiring substrate having a mount surface, a surface wiring layer disposed on the mount surface, and an inner wiring layer formed within the substrate, the surface wiring layer including a ground conductor disposed on the mount surface and connected to a ground potential, and lands;
   a first mount component mounted on the mount surface via the lands;
   a second mount component mounted on the mount surface via the lands, and electrically connected to the first mount component via the inner wiring layer;
   a sealing body formed on the mount surface, covering the first mount component and the second mount component and having a trench formed to extend downward in a depth direction from an upper end thereof at a main surface of the sealing body to a bottom end thereof at a surface of the ground conductor and being disposed between the first mount component and the second mount component, the trench being in contact with the ground conductor at the bottom end of the trench; and
   a shield having an inner shield section formed within the trench that abuts on the surface wiring layer and an outer shield section covering the sealing body and the inner shield section,
   wherein the inner wiring layer includes a plurality of inner wiring layers, and
   the first mount component and the second mount component are mutually electrically connected by an upper one of the inner wiring layers adjacent to the surface wiring layer and crossing beneath the bottom end of the trench and the ground conductor facing the bottom end of the trench when viewed in the depth direction of the trench.

2. The circuit module according to claim 1, wherein
   the circuit substrate further includes a component-containing layer formed between the plurality of inner wiring layers for containing a built-in component, and
   the upper wiring layer is disposed closer to the mount surface than to the bottom of the component-containing layer.

3. The circuit module according to claim 2, wherein
   the circuit substrate further includes a conductive core section formed in the component-containing layer and disposed surrounding the built-in component.

* * * * *